United States Patent
Swanson et al.

(10) Patent No.: US 11,451,241 B2
(45) Date of Patent: Sep. 20, 2022

(54) SETTING VALUES OF PORTIONS OF REGISTERS BASED ON BIT VALUES

(71) Applicant: ADVANCED MICRO DEVICES, INC., Santa Clara, CA (US)

(72) Inventors: Erik Swanson, Fort Collins, CO (US); Sneha V. Desai, Fort Collins, CO (US); Michael Estlick, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 56 days.

(21) Appl. No.: 15/842,027

(22) Filed: Dec. 14, 2017

(65) Prior Publication Data
US 2019/0190536 A1    Jun. 20, 2019

(51) Int. Cl.
*G06F 12/08* (2016.01)
*H03M 7/20* (2006.01)
*G06F 16/16* (2019.01)
*G06F 16/903* (2019.01)
*G06F 12/0891* (2016.01)

(52) U.S. Cl.
CPC .......... *H03M 7/20* (2013.01); *G06F 12/0891* (2013.01); *G06F 16/166* (2019.01); *G06F 16/90339* (2019.01)

(58) Field of Classification Search
CPC ..... H03M 7/20; G06F 16/166; G06F 12/0891
See application file for complete search history.

(56) References Cited

U.S. PATENT DOCUMENTS

| | | | |
|---|---|---|---|
| 7,043,626 B1* | 5/2006 | McMinn | G06F 9/384 712/216 |
| 7,155,718 B1* | 12/2006 | Joffe | G06F 9/3824 718/102 |
| 2005/0050372 A1* | 3/2005 | Hagiwara | G06F 9/30167 713/320 |
| 2016/0026467 A1* | 1/2016 | Sperber | G06F 9/30036 712/210 |
| 2016/0217080 A1* | 7/2016 | Solihin | G06F 12/0891 |

* cited by examiner

*Primary Examiner* — Arpan P. Savla
*Assistant Examiner* — Eric T Loonan

(57) ABSTRACT

A processor employs a set of bits to indicate values of portions of registers of a register file. In response to a specified instruction indicating an expected change of instruction types to be executed, the processor sets one or more of the bits and, for subsequent instructions, interprets corresponding portions of the registers as having a specified value (e.g., zero). By employing the set of bits to set the values of the register portions, rather than setting the individual portions of the registers to the specified value, the processor conserves processor resources (e.g., power) when the processor transitions between executing instructions of different types.

18 Claims, 4 Drawing Sheets

SETTING VALUES OF PORTIONS OF REGISTERS BASED ON BIT VALUES

BACKGROUND

The instruction set for a processor, and the associated processor design, evolves over time to provide for improved processor functionality and efficiency. However, the processor is typically designed to support legacy instructions, thereby allowing the processor to execute a wider variety of software and applications. For example, an N-bit processor (that is, a processor that executes instructions that can operate on N-bit operands) can be configured to execute instructions that operate on operands having a bit width of M, where M smaller than N. As the processor transitions between sets of M-bit instructions and N-bit instructions, selected portions of the processor are reconfigured to execute the instructions at the current bit width. However, these reconfigurations consume processor resources, and can therefore negatively impact processing efficiency.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
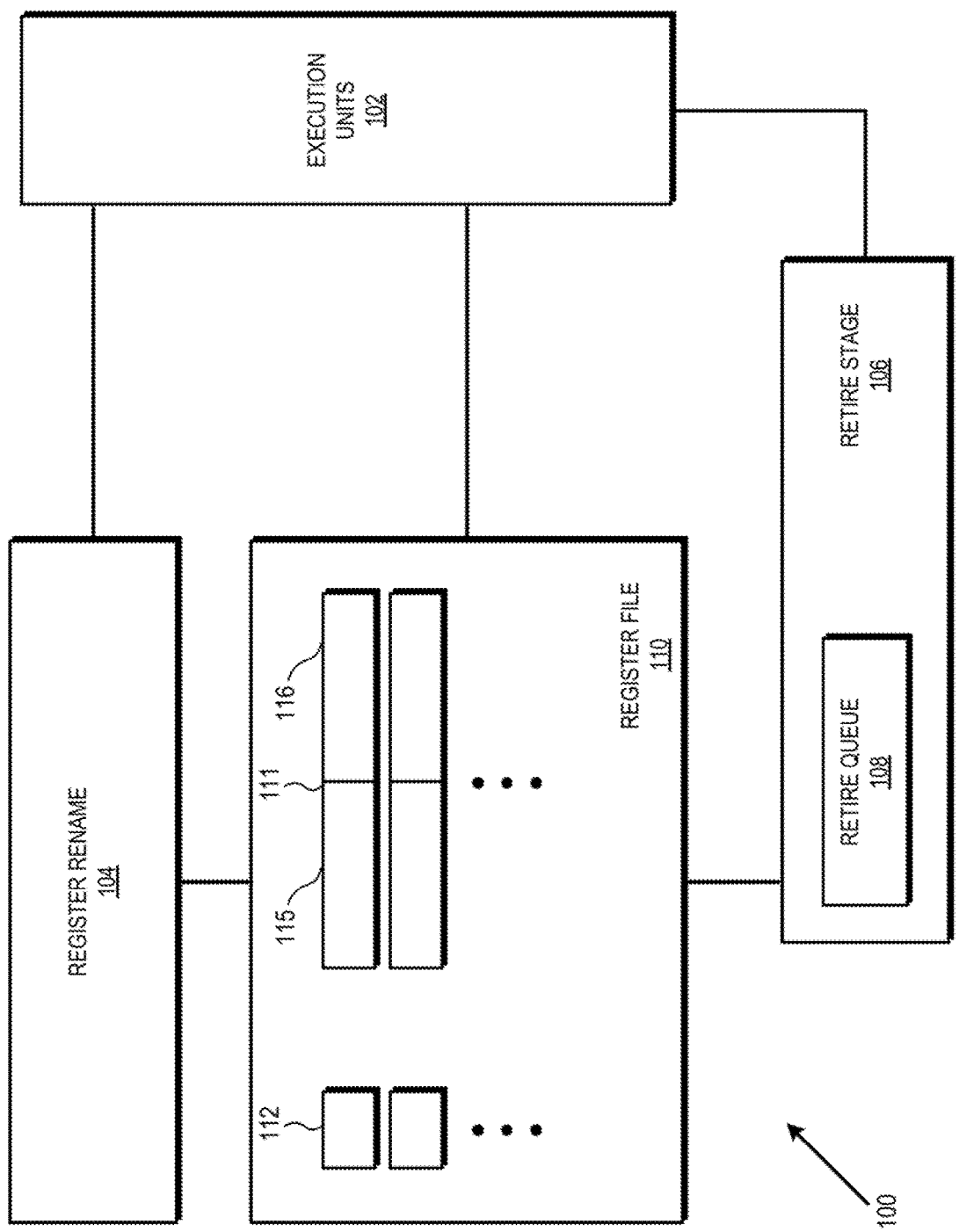
FIG. 1 is a block diagram of a processor that supports instructions of different bit widths by employing a set of bits to indicate values of corresponding registers in accordance with some embodiments.

FIGS. 1-4 illustrate techniques for employing a set of bits of a processor to indicate values of portions of registers of a register file in accordance with some embodiments. In response to a specified instruction indicating an expected change of instruction types to be executed, the processor sets one or more of the bits and, for subsequent instructions, interprets corresponding portions of the registers as having a specified value (e.g., zero). By employing the set of bits to set the values of the register portions, rather than setting the individual portions of the registers to the specified value, the processor conserves processor resources (e.g., power) when the processor transitions between executing instructions of different types.

To illustrate via an example, in some embodiments processors having an x86 architecture support execution of two types of vector arithmetic instructions: Streaming Single Instruction Multiple Data (SIMD) Extensions (SSE) instructions and Advanced Vector eXtension (AVX) instructions. AVX instructions manipulate 256-bit operands and SSE instructions manipulate 128-bit operands. Accordingly, a processor that employs a register file with 256-bit registers can support execution of both AVX and SSE instructions. For example, the processor can employ the "lower" portion of the registers (the portions corresponding to the 128 least-significant bytes) of the register file to store operands for SSE instructions, and employ the full 256 bytes of the register file to store operands for AVX instructions. However, in some scenarios, one or more registers of the register file transitions between storing 256-bit data and storing 128-bit data. Conventionally, to ensure data coherency, the processor transitions the register between the two data widths by first identifying if the upper portion of the register stores non-zero data and, if so, transferring the contents of the register to a designated storage location, such as system memory. Because this data transfer, particularly for multiple registers, can consume a relatively high amount of processor resources (such as power and clock cycles), the processor supports an instruction, designated VZEROUPPER, that explicitly stores zero values at the upper portion of a specified set of processor registers—in particular, a set of vector registers designated to store SIMD vector data.

Conventionally, the VZEROUPPER instruction is executed by storing a zero value to each bit of the upper half of each vector register. However, storing the zero value itself, as well as checking each bit of the register when an SSE instruction is received, consume an undesirably high amount of processor resources. Using the techniques disclosed herein, the processor employs a set of bits, referred to as Z-bits, wherein a Z-bit having a set state indicates that the upper portion of a corresponding vector register is defined as storing a zero value. The processor does not change the actual contents of a vector register when the corresponding Z-bit is set. Thus, by employing Z-bits to define the values stored at portions of the vector registers, the processor conserves processing resources and improves processing efficiency.

FIG. 1 illustrates a block diagram of a processor 100 that employs Z-bits to define values stored at a set of registers in accordance with some embodiments. For purposes of description, it is assumed that the processor 100 is a general-purpose processor generally configured to execute sets of instructions in order to carry out specified tasks on behalf of an electronic device. Accordingly, the processor 100 can be incorporated into any of a variety of electronic devices, such as a desktop or laptop computer, a server, a tablet, a smartphone, a game console, and the like. To execute the sets of instructions, the processor 100 includes a number of modules not specifically illustrated by FIG. 1, including one or more processor cores, memory controllers, cache memories, input/output (I/O) interfaces, and the like.

In the depicted example, the processor 100 includes execution units 102, a register file 110, a register rename module 104, and a retire stage 106. The execution units 102 are modules generally configured to execute operations dispatched from a dispatch stage (not shown) of an instruction pipeline of the processor 100. The operations are identified by a decoder (not shown) of the instruction pipeline based on instructions specified for execution at the processor 100. In some embodiments, the execution units 102 are SIMD units configured to perform vector operations on one or more operands. In other embodiments, the execution units 102 include modules to execute other types of operations, such as a load/store unit, a floating-point unit, and the like. In addition, the execution units 102 are generally configured to execute operations decoded from instructions of different types. As used herein, a type of instruction refers to a size of the operands manipulated by the instruction. Thus, instructions of different types manipulate operands of different sizes. For example, in some embodiments the execution units 102 execute operations decoded from instructions that manipulate 128-bit operands (referred to as 128-bit instructions) and also execute operations decoded from instructions that manipulate 256-bit operands (referred to as 256-bit instructions). To execute the operations, each of the execution units 102 includes a datapath, which is the path of modules, such arithmetic logic units, of the execution unit through which data proceeds to be processed by the execution unit.

The register file 110 includes a set of registers (e.g., register 111) to store operands for manipulation by the execution units 102. In particular, as the execution units 102 execute operations they read, modify, and store operands at one or more of the registers of the register file 110. In some embodiments, each register of the register file 110 is N-bits wide and can therefore store an operand of up to N bits, wherein N is an integer. N therefore indicates the "largest" instruction type that can be executed at the execution units 102. In some embodiments, when executing an M-bit instruction, where M is smaller than N, the execution units 102 employ different portions of the registers of the register file 110 to store operands.

To illustrate via an example, the register 111 includes an upper portion 115 that stores N/2 bits of data and a lower portion 116 that stores N/2 bits of data. When executing an N-bit instruction (that is, when executing operations decoded from an N-bit instruction), the execution units 102 employ both portions 115 and 116 of the register 111 to store a single operand. When executing an M-bit instruction, where M=N/2, the execution units 102 employ only the lower portion 116 of the register 111 to store an operand.

In some embodiments, the operations executed at the execution units 102 are configured to manipulate an architectural register space, such that each operation designates one or more architectural registers that store the operands for the operation. The register rename module 104 is configured to assign physical registers of the register file 110 to each architectural register. Thus, to execute an operation that designates a given architectural register, the execution units 102 retrieve from the register rename module 104 the physical register of the register file 110 corresponding to the virtual register. To enhance processing efficiency by supporting parallel execution of independent operations that employ the same architectural register, the register rename module 104 can reassign architectural registers to different physical registers over time. Further, in some embodiments the register rename module 104 assigns portions of the physical registers of the register file 110 to architectural registers to support execution of M-bit instructions. Thus, for example, the register rename module 104 assigns the portion 116 of the register 111 to an architectural register to support execution of an M-bit instruction at the execution units 102.

As noted above, in some embodiments the processor 100 can execute instructions that specify storing defined values to one or more registers, or to one or more portions of registers of the register file 110. For example, the VZEROUPPER instruction specifies that a value of zero be stored to the upper portion of vector registers of the register file 110. For purposes of description herein, such instructions are referred to as RDV (register-defined-value) instructions. To facilitate efficient execution of RDV instructions, the register file includes a set of flags, referred to as Z-bits such as Z-bit 112, wherein a Z-bit having a set state indicates that a corresponding register, or portion of a register, of the register file is assigned the defined value, without regard to the actual value stored at the register. For purposes of example, each Z-bit assigns the value of zero to the upper portion of a corresponding register of the register file 110. Thus, the Z-bit 112 having a set state indicates that the upper portion 115 of the register 111 is defined as having a value of zero, without changing the contents actually stored at the upper portion 115. As described further herein, in some embodiments a single RDV instruction can set the Z-bits for multiple architectural registers, thereby setting portions of each of the multiple architectural registers to the defined value 1) without changing any value stored at a physical register; and 2) without assigning different physical registers to the architectural registers. Instead, the processor 100 maintains the same physical to architectural register mapping, and the datapaths of the execution units are configured to use the defined value for the designated portion of the architectural register. The processor 100 thereby conserves the power it would otherwise use to rename the architectural registers or to store the defined value at a portion of the physical register corresponding to the architectural register.

It will be appreciated that in other embodiments the Z-bits can define values other than zero for registers or portions of registers. Further, in some embodiments the register file 110 includes multiple Z-bits for each register, wherein the state of each Z-bit defines the value for a different portion of the corresponding register. For example, in some embodiments the register 111 is associated with two Z-bits, designated ZH and ZL, whereby the ZH bit defines the value of the upper portion 115 and the ZL bit defines the value of the lower portion 116. In addition, in some embodiments the state of a Z-bit defines the value of multiple registers of the register file 110, or portions of multiple registers. For example, in some embodiments the Z-bit 112 having a set state indicates that the upper portion of multiple registers of the register file 110 each have a defined value of zero.

As noted above, for the example of FIG. 1 a Z-bit 112 having a set state defines the value of the upper portion of a corresponding register of the register file 110 as having a value of zero, but the value of the upper portion is not changed. That is, the value of the upper portion of the register "appears" to operations executing at the execution units 102 as having a value of zero, irrespective of the actual value stored at the upper portion of the register. To facilitate defining the value of the upper portion of the register in this way, the processor 100 employs the register rename module 104. In particular, in response to a Z-bit for a given register portion being set, the register rename module 104 sends to the datapath of the execution unit the architectural register and the Z-bit value. In response to the Z-bit being in the set state, the datapath of the execution unit treats the upper portion of the data corresponding to the physical register as having a value of zero. For example, in some embodiments, in response to the Z-bit being set, the datapath reads only the lower portion of the corresponding physical register, and uses a value of zero for the upper portion of the physical register.

In some embodiments, the Z-bits are included in a register rename map at the register rename module 104, thereby allowing the register rename module 104 to change the value of a portion of an architectural register to the defined value by setting the corresponding Z-bit. An example rename map including Z-bits is set forth below:

| Arch Register | Physical Register | Z-bit |
|---|---|---|
| YMM0 | P7 | 0 |
| YMM1 | P58 | 1 |
| YMM2 | P19 | 0 |

To access the value of an architectural register, the datapath of an execution unit requests from the register rename module 104 both the physical register assigned to the architectural register and the Z-bit value for the architectural register. If the Z-bit is in the cleared state, the datapath accesses the entire value stored at the physical register. If the Z-bit is in the set state, the datapath accesses only a specified portion (e.g., the lower half) of the physical register to determine the value of the architectural register and treats the other portion (e.g., the upper half) of the value as having the defined value. The retire stage 106 is generally configured to receive state and other information for operations executed at the processor 100, and to store the information at a retire queue 108 until the processor 100 indicates that the instruction corresponding to the information is to be committed (also referred to as retired). In some embodiments, in response to an indication from the processor 100 that the instruction pipeline is to be returned to an earlier state (e.g., in response to identifying a mispredicted branch, a memory error, and the like), the retire state provides information stored at the retire queue 108 to other modules of the instruction pipeline, thereby placing the modules in the earlier state.

In some embodiments, in response to specified criteria, the register file 110 transfers the state of the Z-bits, and the contents of the associated register portions, to the retire queue 108. For example, in response to the RDV instruction executing speculatively, the register file 110 transfers the Z-bits to the retire queue 108, where the state of the Z-bits are stored until the RDV instruction is committed. In response to identifying that the RDV instruction is flushed, the retire stage 106 transfers the state of the Z-bits back to the register file 110, thereby returning the register file 110 to an earlier state.

Figure 2:
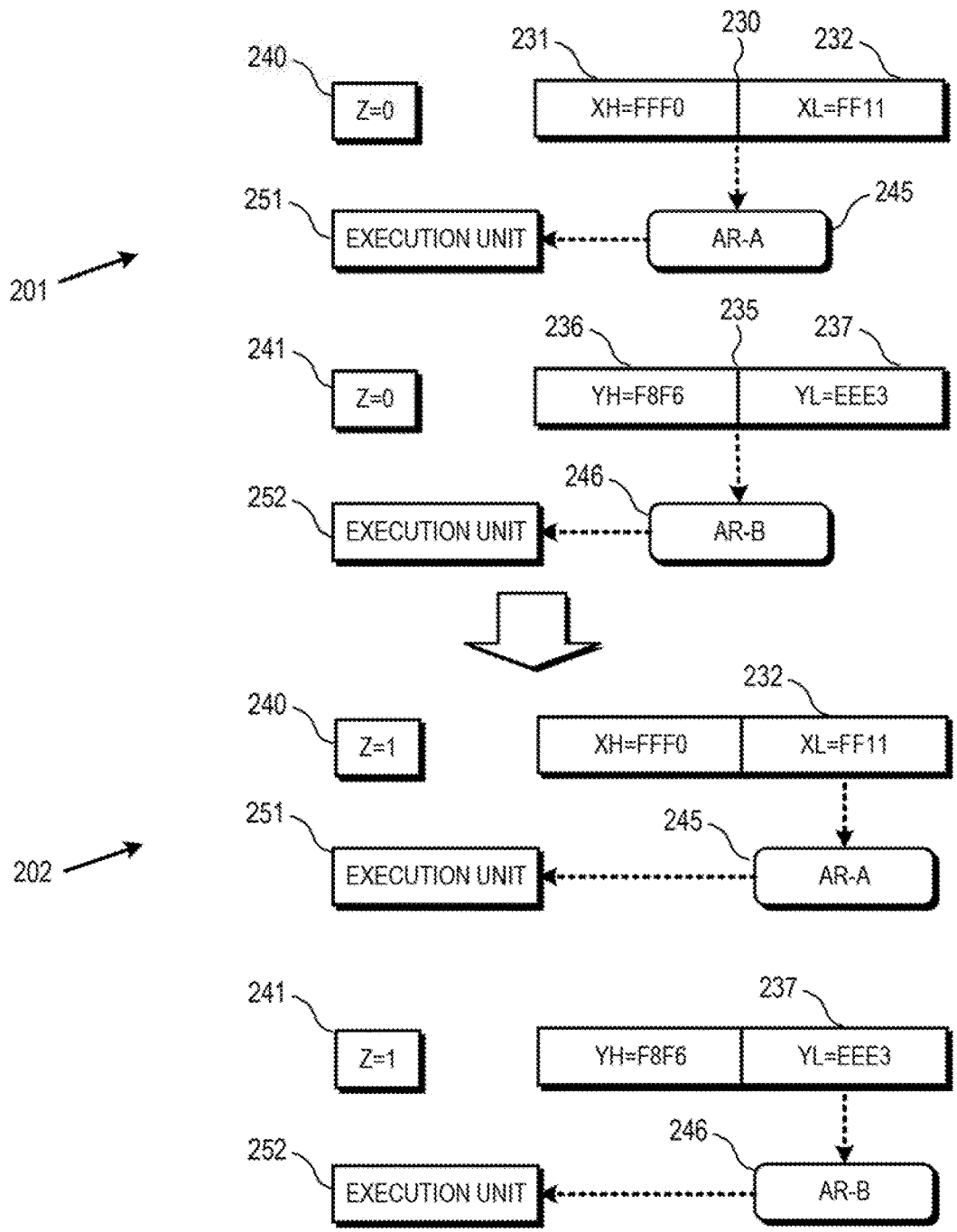
FIG. 2 is a diagram depicting an example of the processor of FIG. 1 employing a register rename module to set values of registers based on the set of bits in accordance with some embodiments.

FIG. 2 illustrates an example of the processor 100 defining the value of portions of registers of the register file 110 using Z-bits in accordance with some embodiments. In particular, the register file 110, in one embodiment, includes registers 230 and 235 and corresponding Z-bits 240 and 241. For ease of description, the registers 230 and 235 are illustrated as 32-bit registers, but in other embodiments the registers 230 and 235 are of a different size, such as 256-bit registers. Each of the registers 230 and 235 includes an upper portion and a lower portion. In particular, register 230 includes an upper portion 231 and a lower portion 232 and register 235 includes an upper portion 236 and a lower portion 237.

In the illustrated example, at a time 201 the execution units 102 are assumed to be executing 32-bit operations. Accordingly, at time 201 the Z-bits 240 and 241 are each in a negated (unset) state. In addition, at time 201 the register rename module 104 has assigned an architectural register 245 (designated AR-A) to the register 230 and has assigned an architectural register 246 (designated AR-B) to the register 235. Thus, for operations that employ AR-A as an operand, the datapath of an execution unit 251 employs the entire value stored at the register 230. For operations that employ AR-B as an operand, the datapath of an execution unit 252 employs the entire value stored at the register 235.

At or around a time 202, the execution units receive an RDV instruction, such as VZEROUPPER, to prepare the execution units 102 to execute 16-bit instructions, and in particular to set the values of the upper portions 231 and 236 to a defined value of zero. In response, the execution units 102 change the value of each of the Z-bits 240 and 241 to an asserted (set) state. Responsive to the Z-bit 240 being in the set state, the datapath of the execution unit 251 reads only the lower portion 232 of the register 230 to perform an operation, and treats the upper portion 231 as having a value of zero. Similarly, responsive to the Z-bit 241 being in the set state, the datapath of the execution unit 251 reads only the lower portion 237 of the register 235 to perform an operation, and treats the upper portion 236 as having a value of zero. The processor 100 thereby defines the value for registers, or portions of registers, while conserving processor resources.

Figure 3:
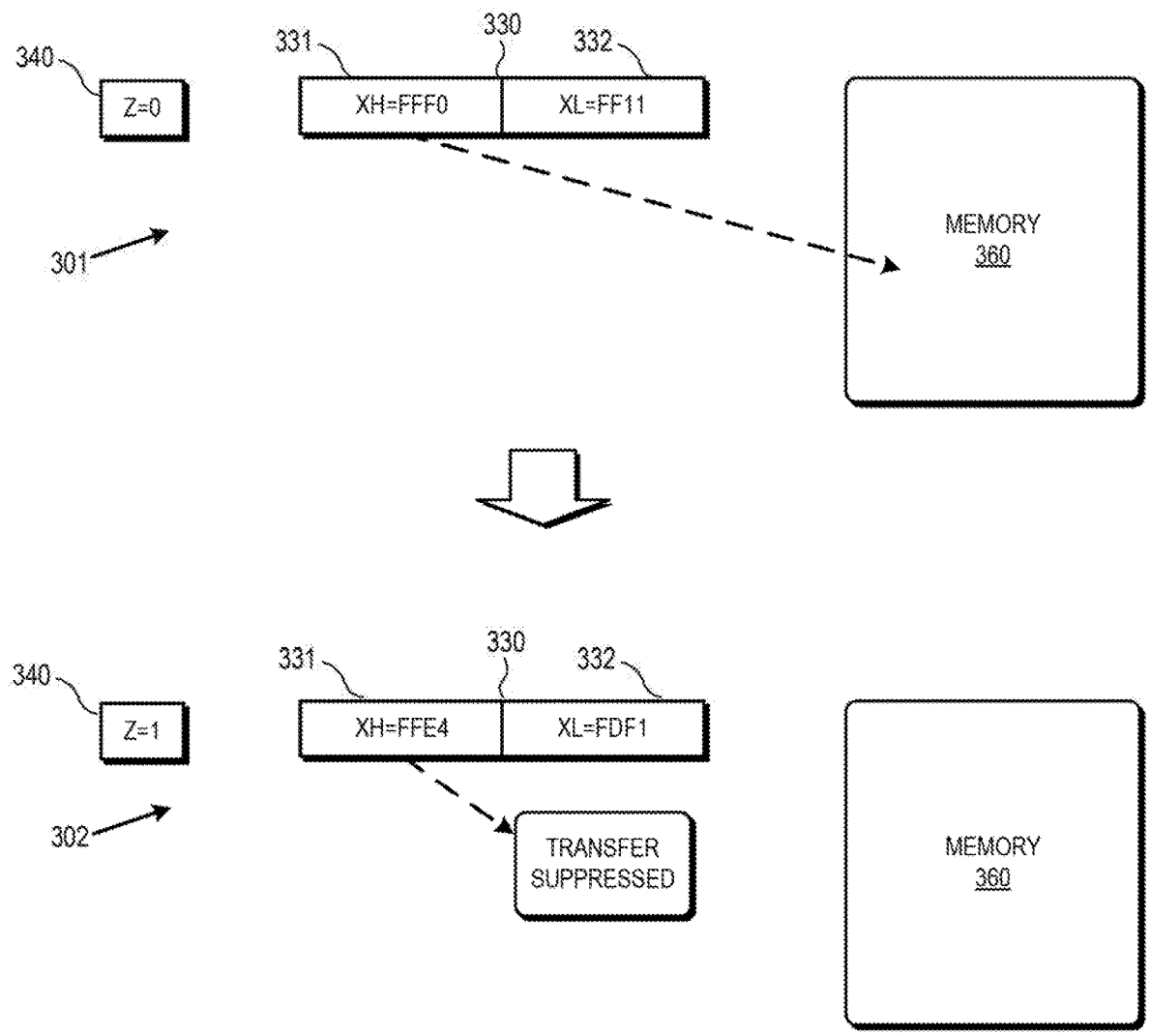
FIG. 3 is a diagram depicting an example of the processor of FIG. 1 suppressing transfer of data to a memory based on the set of bits in accordance with some embodiments.

In some embodiments, the Z-bits of the register file 110 can be used to simplify transitions between types of instructions at the execution units 102. FIG. 3 illustrates an example Z-bit 340 and a corresponding register 330 of the register file 110 (FIG. 1). The register 330 includes an upper portion 331 and a lower portion 332. In the example of FIG. 3, at or around a time 301, the processor 100 detects a change in the type of instructions being executed at the execution units 102 from N-bit instructions to M-bit instructions, where M is less than N.

In response to detecting the change in instruction type, the processor 100 initially checks the state of the Z-bit 340. Responsive to the Z-bit 340 being in the negated state, the processor 100 determines that the value of the upper portion 331 of the register 330 has not been defined to have the value zero. Therefore, to preserve data coherence, the processor 100 transfers the value stored at the upper portion 331 to a memory 360. In some embodiments, in response to the execution units 102 returning to execute N-bit instructions, the processor 100 retrieves the value from the memory 360 and returns the value to the upper portion 331.

At time 302, the processor 100 again detects a change in the instruction type from N-bit instructions to M-bit instructions. In response, the processor 100 checks the state of the Z-bit 340. Responsive to the Z-bit 340 being in the asserted state, the processor 100 determines that the value of the upper portion 331 of the register 330 has been defined to have the value zero, although that actual value stored at the upper portion 331 is a non-zero value. Because the value of the upper portion 331 is defined to be zero by the state of the Z-bit 340, the processor 100 suppresses transfer of data stored at the upper portion 331 to the memory 360, thus conserving processor resources.

Figure 4:
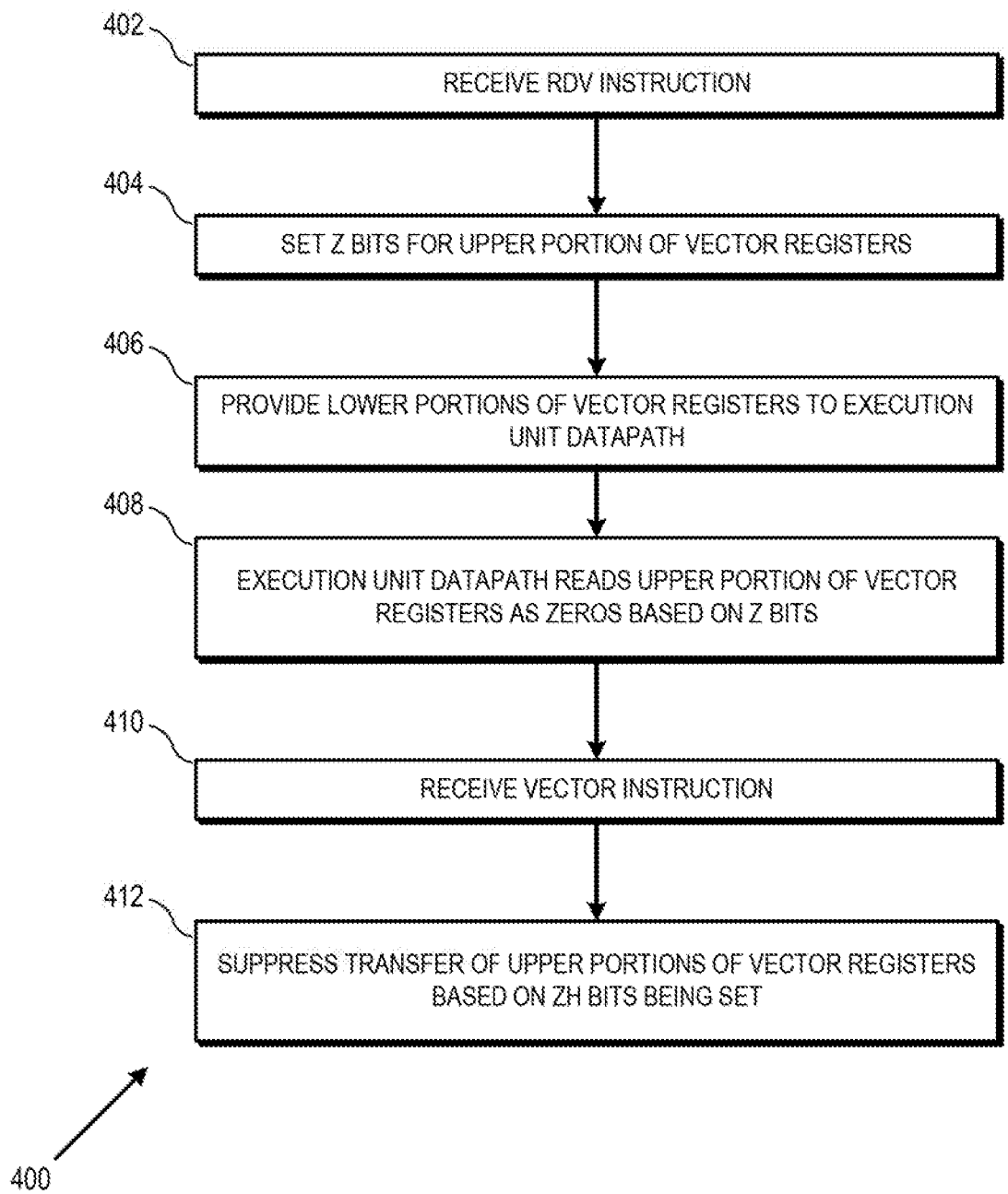
FIG. 4 is a flow diagram of a method of employing a set of bits to indicate values of portions of registers of a register file in accordance with some embodiments.

FIG. 4 illustrates a flow diagram of a method 400 of employing a set of bits to indicate values of portions of registers of a register file in accordance with some embodiments. The method 400 is described with respect to an example implementation at the processor 100 of FIG. 1. At block 402, the execution units 102 receive operations decodes from a RDV instruction, such as a VZEROUPPER instruction, to define the upper portions of each of a plurality of registers of the register file 110 as storing the defined value zero. For purposes of description of the method 400, it is assumed that the plurality of registers corresponds to vector registers of the processor 100 designated to store vector data for SIMD operations.

At block 404, in response to the RDV instruction, the execution units 102 set the value for each Z-bit corresponding to a vector register to an asserted, or set, state. At block 406, responsive to the Z-bits being in the set state, the datapaths of the execution units 102 read the lower portions of the vector registers to perform operations. At block 408, based on the Z-bits being in the asserted state, the datapaths of the execution units 102 treat the upper portions of the vector registers as having the defined value of zero. The processor 100 thus defines the value for the upper portion of each of the vector registers to zero, but maintains the actual values stored at upper portions of the physical registers corresponding to the vector registers.

At block 410, the execution units 102 receive a vector instruction indicating a change in instruction type from N-bit instructions to M-bit instructions. In response, at block 412 the processor 100 identifies that the Z-bits for the vector registers are in the asserted state, and therefore suppresses transfer of data from the upper portions of the vector registers to memory.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method, comprising:
   receiving, at a processor, a first instruction to assign a first portion of a first register a zero value, the first portion of the first register storing a first value when the first instruction is received, wherein the first value is a non-zero value;
   in response to the first instruction, setting a first flag of the processor to a first state and maintaining the first value at the processor, whereby the first flag indicates that the first portion of the first register is assigned the zero value while storing the first value; and
   in response to a second instruction, reading a second portion of the first register while suppressing transfer of the first portion of the first register to a memory responsive to the first flag of the processor having the first state.

2. The method of claim 1, wherein maintaining the first value at the processor comprises maintaining the first value at the first portion of the first register.

3. The method of claim 1, further comprising:
   transferring the first value to a retire queue at an instruction pipeline of the processor.

4. The method of claim 1, further comprising:
   in response to the first instruction, setting a second flag of the processor to the first state and maintaining at the processor a second value stored at a first portion of a second register; and
   in response to the second instruction, suppressing transfer of the first portion of the second register responsive to the second flag of the processor having the first state.

5. The method of claim 1, further comprising:
   in response to the second instruction, suppressing transfer of a first portion of a second register responsive to the first flag of the processor having the first state.

6. The method of claim 1, further comprising:
   in response to the first flag having the first state, setting a first portion of an architectural register of the processor to the zero value.

7. The method of claim 1, wherein the first instruction is a VZEROUPPER instruction.

8. A method, comprising:
   assigning a first architectural register of a processor to a first physical register;
   receiving, at the processor, a first instruction to assign a portion of the first architectural register a zero value;
   in response to the first instruction, setting a first flag of the processor to a first state and maintaining a first value at the first physical register different than the zero value, whereby the first flag indicates that the portion of the first architectural register is assigned the zero value while storing the first value; and
   in response to the first flag being set, maintaining the assignment of the first architectural register to the first physical register; and
   in response to a second instruction, reading a second portion of the first architectural register while suppressing transfer of the first value stored at the portion of the first architectural register to a memory.

9. The method of claim 8, further comprising:
   in response to the first instruction, transferring the first flag to a retire queue of the processor.

10. The method of claim 8, further comprising:
    in response to the first flag being set, setting portions of each of a plurality of registers to the zero value and maintaining architectural registers assigned to the plurality of registers.

11. The method of claim 8, further comprising:
    in response to the first flag being set, executing an operation at an execution unit of the processor as if the portion of the first physical register stored the zero value.

12. The method of claim 8, wherein the first instruction is a VZEROUPPER instruction.

13. A processor, comprising:
    a register file comprising a first register;
    a first flag corresponding to the first register, the first flag configured to indicate if a first portion of the first register is assigned a zero value different than a non-zero value stored at the first register; and
    a set of execution units configured to:
       set the first flag to a first state in response to a first instruction; and in response to a second instruction reading a second portion of the first register different than the first portion while suppressing transfer of the first portion of the first register to a memory responsive to the first flag of the processor having the first state.

14. The processor of claim 13, wherein the set of execution units is configured to maintain a first value at the first portion of the first register in response to the first instruction.

15. The processor of claim 14, wherein the register file is configured to transfer the first value to a retire queue at an instruction pipeline of the processor.

16. The processor of claim 13, further comprising:
a second flag configured to indicate if a first portion of a second register contains the zero value.

17. The processor of claim 13, further comprising:
a register rename module configured to, in response to the first flag having the first state, set a first portion of an architectural register to the zero value.

18. The processor of claim 13, wherein the first instruction is a VZEROUPPER instruction.

* * * * *